(12) United States Patent
Nakajima et al.

(10) Patent No.: US 7,995,972 B2
(45) Date of Patent: *Aug. 9, 2011

(54) ELECTRONIC COMPONENT FOR COMMUNICATION DEVICE AND SEMICONDUCTOR DEVICE FOR SWITCHING TRANSMISSION AND RECEPTION

(75) Inventors: Akishige Nakajima, Higashiyamato (JP); Takashi Ogawa, Kawaguchi (JP); Hidenori Suenaga, Komoro (JP); Eigo Tange, Takasaki (JP); Shinya Osakabe, Takasaki (JP); Yasushi Shigeno, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 419 days.

This patent is subject to a terminal disclaimer.

(21) Appl. No.: 12/222,193

(22) Filed: Aug. 5, 2008

(65) Prior Publication Data

US 2008/0299914 A1 Dec. 4, 2008

Related U.S. Application Data

(60) Continuation of application No. 11/892,044, filed on Aug. 20, 2007, now Pat. No. 7,437,129, which is a division of application No. 10/921,211, filed on Aug. 19, 2004, now Pat. No. 7,269,392.

(30) Foreign Application Priority Data

Aug. 27, 2003 (JP) ................................ 2003-208960

(51) Int. Cl.
*H04B 1/44* (2006.01)

(52) U.S. Cl. ...................................... 455/83; 455/552.1
(58) Field of Classification Search .................... 455/78, 455/79, 82–84, 552.1, 103; 333/100–101; 327/365

See application file for complete search history.

(56) References Cited

U.S. PATENT DOCUMENTS

| | | | |
|---|---|---|---|
| 4,810,911 A | 3/1989 | Noguchi | 327/431 |
| 5,812,939 A | 9/1998 | Kohama | 455/78 |
| 6,185,434 B1 | 2/2001 | Hagstrom et al. | 455/552.1 |
| 6,573,529 B2 | 6/2003 | Asano et al. | 257/20 |
| 6,835,968 B2 | 12/2004 | Kitazawa et al. | 257/107 |
| 7,269,392 B2 | 9/2007 | Nakajima et al. | 455/83 |
| 7,437,129 B2* | 10/2008 | Nakajima et al. | 455/83 |
| 2003/0207668 A1 | 11/2003 | McFarland et al. | 455/3.01 |
| 2004/0113747 A1 | 6/2004 | Kelcourse | 337/167 |

FOREIGN PATENT DOCUMENTS

JP 2003051751 2/2003

* cited by examiner

*Primary Examiner* — Nguyen Vo
(74) *Attorney, Agent, or Firm* — Mattingly & Malur, PC

(57) ABSTRACT

There are provided a transmission/reception switching circuit which is small in insertion loss and harmonic distortion and allows an increase in the output power of a power amplifier and an electronic component for communication on which the transmission/reception switching circuit is mounted. As an element composing a transmission/reception switching circuit in a wireless communication system, series-connected FETs or a multi-gate FET are used in place of a diode. Gate resistors connected between the individual gate terminals and a control terminal are designed to have resistance values which become progressively smaller from the gate to which a highest voltage is applied toward the gate to which a lowest voltage is applied.

5 Claims, 9 Drawing Sheets

ELECTRONIC COMPONENT FOR COMMUNICATION DEVICE AND SEMICONDUCTOR DEVICE FOR SWITCHING TRANSMISSION AND RECEPTION

CROSS-REFERENCE TO RELATED APPLICATION

The present application is a continuation of application Ser. No. 11/892,044, filed Aug. 20, 2007; which is a divisional of application Ser. No. 10/921,211, filed Aug. 19, 2004, now U.S. Pat. No. 7,269,392, which claims priority from Japanese Patent Application JP 2003-208960 filed on Aug. 27, 2003, the content of which are hereby incorporated by reference into this application.

BACKGROUND OF THE INVENTION

The present invention relates to a technology which is effective when is applied to a transmission/reception switching circuit in a wireless communication system and further to the case where isolation between an antenna and a receiver circuit is thereby improved by reducing insertion loss. More particularly, the present invention relates to a technology which is effective when applied to a semiconductor integrated circuit formed with a transmission/reception switching circuit used in, e.g., a mobile phone, to a front-end module on which the semiconductor integrated circuit, a lowpass filter, an impedance matching circuit, and the like are mounted, and further to an electronic component for communication such as a power module obtained by mounting a high-output amplification circuit on the front-end module.

There have conventionally been dual band mobile phones each capable of handling signals in two frequency bands such as, e.g., a GSM (Global System for Mobile Communication) band ranging from 880 to 915 MHz and a DCS (Digital Cellular System) band ranging from 1710 to 1785 MHz. In recent years, there have also been demands for a triple band mobile phone capable of handling signals in, e.g., a PCS (Personal Communication System) band ranging from 1850 to 1915 MHz in addition to signals in the GSM and DCS bands and for a quad band mobile phone capable of handling signals in the EP GSM mode using a 800 MHz band and signals in the US GSM mode using a 850 MHz.

A conventional mobile phone has typically been constituted by: an electronic component termed a power module on which a semiconductor integrated circuit (generally termed an RF IC) having the function of up-converting and modulating a signal to be transmitted and down-converting and demodulating a received signal, a semiconductor integrated circuit (baseband IC) having the function of converting data to be transmitted to I and Q signals and restoring received data from the demodulated I and Q signals, an RF power amplifier and a bias circuit therefor, an impedance matching circuit, and the like are mounted; an electronic component termed a front end module on which a transmission/reception switching circuit, a lowpass filter, an impedance matching circuit, and the like are mounted; and the like.

Most of transmission/reception switching circuits used in conventional mobile phones have used diodes to reduce insertion loss. As an example of the invention relating to a front end module on which a switch circuit using a diode is mounted, there can be listed one disclosed in Patent Document 1. In the present specification, a plurality of semiconductor chips and discrete components which are mounted on an insulating substrate, such as a ceramic substrate with printed wiring provided on the surface or in the inside thereof, and which can be handled as if they compose a single electronic component with the individual components being combined by the printed wiring and bonding wires to perform a specified function will be termed a module.

[Patent Document 1] Japanese Unexamined Patent Publication No. 2003-051751

SUMMARY OF THE INVENTION

A transmission/reception switching circuit using a diode uses discrete components. Therefore, in a system requiring a plurality of diodes such as a quad band system, a module on which it is mounted has the problems of increased size and high current consumption particularly. In addition to a diode element, the transmission/reception switching circuit using a diode also requires a λ/4 microstrip line having a length of approximately 5 mm, which causes a further increase in the size of the module.

To solve the problems, the present inventors have examined a transmission/reception switching circuit using a FET (field effect transistor) in place of a diode. As a result, it was proved that the transmission/reception switching circuit using a FET has the following problem. That is, if the level of a signal inputted to the source or drain of the transistor in the OFF state is high in the transmission/reception switching circuit using a FET, the input power turns the transistor ON. Accordingly, the output power of a power amplifier cannot be increased, while an output signal is distorted and the quantities of harmonic components are thereby increased. A detailed description will be given herein below to the problem.

FIG. 11 shows a transmission/reception switch circuit using a HEMT (high electron mobility transistor) examined by the present inventors. The transmission/reception switch circuit of FIG. 11 is constituted by: a first switch transistor Q1 connected between a transmitter terminal Tx connected to the output terminal of a power amplifier and a common terminal COM connected to an antenna; and a second switch transistor Q2 connected between the common terminal COM connected to the antenna and a receiver terminal Rx to which the input terminal of a receiving circuit such as a low noise amplifier is connected. A dc voltage Vdc is constantly applied to the transmitter terminal Tx and the receiver terminal Rx via respective inductors L1 and L2 such as choke coils.

As transistors Q1 and Q2, depletion-type HEMTs are used. Control voltages Vsw1 and Vsw2 are applied to the respective gate terminals via resistance Rg1 and Rg2 and the dc voltage Vdc is applied to the source and drain terminals of each of the transistors Q1 and Q2. Accordingly, the transistors Q1 and Q2 are brought into the OFF state when the control voltages Vsw1 and Vsw2 are switched to a LOW level such as a ground potential GND (0 V), while they are brought into the ON state when the control voltages Vsw1 and Vsw2 are switched to a HIGH level such as a power source voltage Vcc, though they are of depletion type. Specifically, in a transmission mode, the control voltage Vsw1 is switched to the HIGH level and the control voltage Vsw2 is switched to the LOW level so that the transistor Q1 is brought into the ON state and the transistor Q2 is brought into the OFF state. In a reception mode, the control voltage Vsw1 is switched to the LOW level and the control voltage Vsw2 is switched to the HIGH level so that the transistor Q1 is brought into the OFF state and the transistor Q2 is brought into the ON state.

FIG. 12 shows a circuit equivalent to the transmission/reception switch circuit in the transmission mode in which the transistor Q1 is brought into the ON state and the transistor Q2 is brought into the OFF state. In the transmission mode, the transistor Q1 is represented by a source-drain resistance Ron1, by a gate-source capacitance Cgs1, and by a gate-drain capacitance Cgd1, as shown in FIG. 12. Ron1 represents the on-resistance (channel resistance) of the transistor Q1. On the other hand, the transistor Q2 is represented by a source-drain capacitance Cds2, a gate-source capacitance Cgs2, and a gate-drain capacitance Cgd2. Characteristics required in the transmission mode are a small insertion loss between the transmitter terminal Tx and the common terminal COM connected to the antenna and high isolation between the common terminal COM connected to the antenna and the receiver terminal Rx.

In general, the channel resistance Ron1 of the FET in the ON state is low (1 Ω or less) so that an insertion loss resulting from the transistor Q1 is also low (0.5 dB or less). Accordingly, an output to be transmitted from a power amplifier which has been inputted to the transmitter terminal Tx passes through the resistance Ron1 and is conveyed with a low loss to the common terminal COM connected to the antenna. In the case of an RF signal, however, the signal may leak via the gate-source capacitance Cgs1 of the transistor Q1 shown in FIG. 12 so that an increase in insertion loss resulting from signal leakage is suppressed by providing a gate resistor Rg1 of about 10 kΩ. The arrangement allows low-loss conveyance of the output to be transmitted from the power amplifier to the common terminal COM connected to the antenna via the transistor Q1 so that, in the case of the switch circuit of FIG. 11, the output to be transmitted from the power amplifier is also inputted directly to the transistor Q2. As a result, the isolation characteristic of the transistor Q2 defines a maximum permissible input power.

FIG. 13 shows the waveform (i) of an RF voltage applied to the gate-source capacitance Cgs2 when the transistor Q2 composing the switch circuit of FIG. 11 is in the OFF state and the waveform (ii) of an RF voltage applied to the gate-source capacitance Cgs1 when the transistor Q1 is in the ON state. In the transmission mode, the source-drain resistance Ron1 of the transistor Q1 in the ON state is low (1 Ω or less) so that the difference between a source potential and a drain potential is small. Accordingly, the waveform (i) of the RF voltage applied to the gate-source capacitance Cgs1 of the transistor Q1 has a small amplitude.

By contrast, the source and drain of the transistor Q2 in the OFF state are coupled to each other via a capacitance, while a signal at an antenna terminal changes by using the dc voltage Vdc as a bias point and 0 V is applied to the gate terminal of the transistor Q2. Accordingly, if the center potential of the waveform (ii) of the RF voltage applied to the gate-source capacitance Cgs1 of the transistor Q1 is assumed to be "0", such an RF voltage as has the waveform (i) centering around a value of −Vdc and having an amplitude of 2 (|Vdc|−|Vth|) is applied to the gate-source capacitance Cgs2 of the transistor Q2 in the OFF state. Here, Vth represents the threshold voltage of each of the transistors Q1 and Q2 so that, if a voltage higher than a value given by |Vdc|−|Vth| is applied between the gate and source of the transistor Q2, the transistor Q2 is turned ON and an RF signal conveyed to the antenna terminal via the transistor Q1 leaks to the receiver terminal Rx.

Accordingly, the amplitude of the maximum permissible input power in the switch circuit of FIG. 11 becomes 2 (|Vdc|−|Vth|). If the power amplifier outputs an RF signal of a power higher than this, the insertion loss of the switch circuit is increased accordingly and harmonics are generated.

Although it is possible to increase the amplitude of the maximum permissible input power if the threshold voltage Vth of each of the transistors Q1 and Q2 is reduced, the on-resistance Ron is increased if the threshold voltage Vth is reduced and the insertion loss is thereby increased, so that a reduction in threshold voltage Vth is not preferred.

It is therefore an object of the present invention to provide a transmission/reception switching circuit which can be reduced in size and current consumption by reducing the number of components composing a system and a module and thereby increasing the mounting density and provide an electronic component for communication on which the transmission/reception switching circuit is mounted. Another object of the present invention is to provide a transmission/reception switching circuit which is small in insertion loss and harmonic distortion and provide an electronic component for communication on which the transmission/reception switching circuit is mounted.

Still another object of the present invention is to provide a transmission/reception switching circuit which allows an increase in the output power of the power amplifier and an electronic component for communication on which the transmission/reception switching circuit is mounted.

The above and other objects and novel features of the present invention will become apparent from the description of the present specification and the accompanying drawings.

The following is a brief description given to the outline of the representative aspects of the present invention disclosed in the present application.

Specifically, FETs connected in series or a multi-gate FET is used in place of a diode as an element composing a transmission/reception switching circuit in a wireless communication system such that the resistance values of gate resistors connected between individual gate terminals and a control terminal become progressively lower in a direction from the gate to which a highest voltage is applied toward the gate to which a lowest voltage is applied. Alternatively, in a switch circuit composed of a first transistor connected between a transmitter terminal to which a signal to be transmitted is inputted and a terminal connected to an antenna and a second transistor connected between the terminal connected to the antenna and a receiver terminal for supplying a received signal to a reception circuit, a dc voltage for biasing is applied preferably to each of the transmitter terminal and the terminal connected to the antenna.

With the foregoing means, the number of components composing the system and a module can be reduced and the mounting density can be increased by using the FET or FETs in place of a diode as an element composing the switch circuit. By progressively reducing the resistance values of the gate resistors in the direction from the gate to which a highest voltage is applied toward the gate to which a lowest voltage is applied, it becomes possible to circumvent the situation in which the FET to which a higher voltage is inputted is brought into the ON state earlier, reduce insertion loss, and thereby reduce harmonic distortion. By applying a dc voltage for biasing to each of the transmitter terminal and the terminal connected to the antenna, the maximum permissible power of an RF signal inputted to the transmitter terminal can be increased.

DESCRIPTION OF THE PREFERRED EMBODIMENTS

Figure 1:
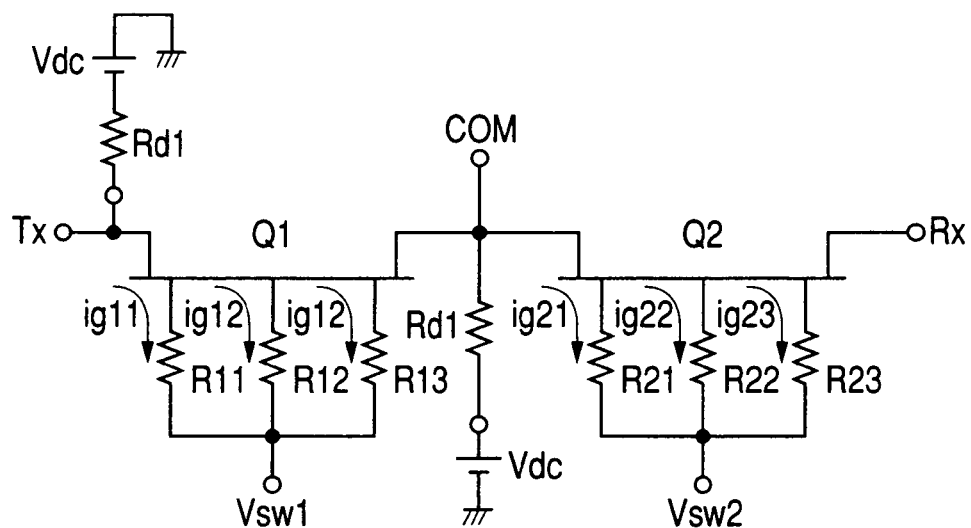
FIG. 1 is a circuit diagram showing a structure of a first embodiment of a transmission/reception switch circuit according to the present invention.

FIG. 1 shows a first embodiment of a transmission/reception switch circuit according to the present embodiment. The transmission/reception switch circuit of the present embodiment is formed as a semiconductor integrated circuit on a semiconductor substrate such as a GaAs chip. The transmission/reception switch circuit of the present embodiment comprises: a first switch transistor Q1 connected between a transmitter terminal Tx connected to the output terminal of a power amplifier and a common terminal COM connected to an antenna; and a second switch transistor Q2 connected between the foregoing common terminal COM and a receiver terminal Rx to which the input terminal of a receiving circuit such as a low noise amplifier is connected. A dc voltage Vdc is applied to the foregoing transmitter terminal Tx and common terminal COM via respective external resistors Rd1 and Rd2.

As the transistors Q1 and Q2, depletion-type P-channel HEMTs are used. Each of the transistors Q1 and Q2 is formed as a triple gate element in which three gate electrodes are formed relative to one channel. A control voltage Vsw1 is applied to the gate electrodes of the transistor Q1 via respective resistors R11, R12, and R13, while a control voltage Vsw2 is applied to the gate electrodes of the transistor Q2 via respective resistors R21, R22, and R23. Since the dc voltage Vdc has been applied to the source terminal of each of the transistors Q1 and Q2, the transistors Q1 and Q2 are brought into the OFF state when the control voltages Vsw1 and Vsw2 are switched to a LOW level such as a ground potential GND (0 V), while they are brought into the ON state when the control voltages Vsw1 and Vsw2 are switched to a HIGH level such as a power source voltage Vcc, though they are of depletion type.

Specifically, in a transmission mode, the control voltage Vsw1 is switched to the HIGH level and the control voltage Vsw2 is switched to the LOW level so that the transistor Q1 is brought into the ON state and the transistor Q2 is brought into the OFF state. In a reception mode, the control voltage Vsw1 is switched to the LOW level and the control voltage Vsw2 is switched to the HIGH level so that the transistor Q1 is brought into the OFF state and the transistor Q2 is brought into the ON state.

Although the resistors Rd1 and Rd2 are composed of external resistors in the present embodiment, it will easily be understood that they may also be composed of on-chip resistors. Instead of the resistors Rd1 and Rd2, inductors such as choke coils may also be used. However, the use of the resistors facilitates the implementation of an on-chip configuration, achieves a reduction in the number of components, and allows the scaling down of the system. As the resistance values of the resistors Rd1 and Rd2 are larger, it becomes possible to more reliably prevent the leakage of an RF component to signal lines for supplying the control voltages Vsw1 and Vsw2 and an increase in insertion loss. However, excessively large resistance values cause a slow switching response so that it is set to fall within the range of 5 kΩ to 20 kΩ.

In the present embodiment, the respective resistance values r11, r12, and r13 of the gate resistors R11, R12, and R13 for the transistor Q1 have been set to satisfy, e.g., r11=3×r13 and r12=2×r13 such that r11>r12>r13 is established. Likewise, the respective resistance values r21, r22, and r23 of the gate resistors R21, R22, and R23 for the transistor Q2 have also been set to satisfy r21>r22>r23, e.g., r21=3×r23 and r22=2× r23. Here, a value such as 5 kΩ is selected for each of r13 and r23.

Figure 2:
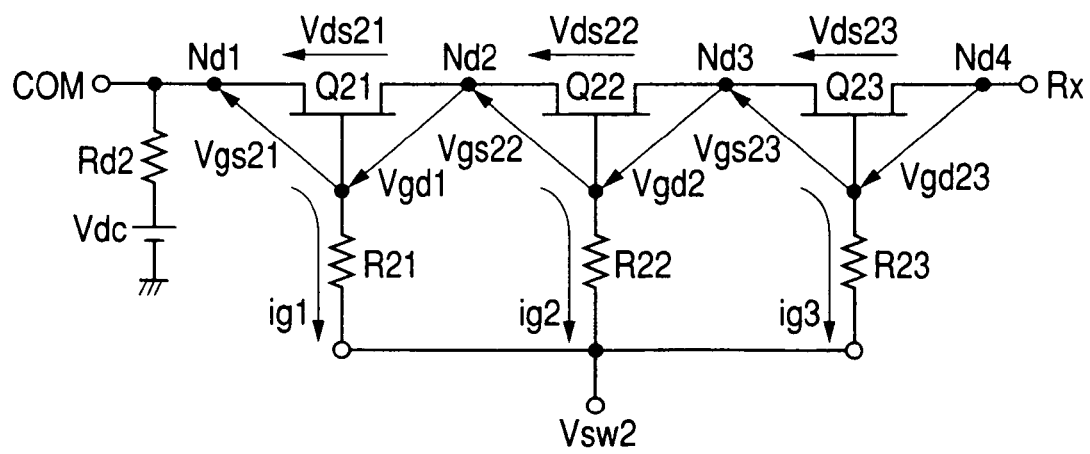
FIG. 2 is a circuit diagram showing a structure of a second embodiment of the transmission/reception switch circuit according to the present invention.

Although the source-drain resistance is slightly higher than in the circuit of FIG. 1, the transmission/reception switch circuit may be constituted by a switch composed of three HEMTs Q21, Q22, and Q23 connected in series such that the respective resistance values r21, r22, and r23 of the gate resistors R21, R22, and R23 satisfy a relationship given by, e.g., r21:r22:r23=3:2:1 and by a switch (the depiction thereof is omitted) composed of three transistors Q11, Q12, and Q13 connected in series such that the respective resistance values r11, r12, and r13 of the gate resistors R11, R12, and R13 similarly satisfy a relationship given by, e.g., r11:r12:r13=3: 2:1, as shown in FIG. 2.

Figure 3:
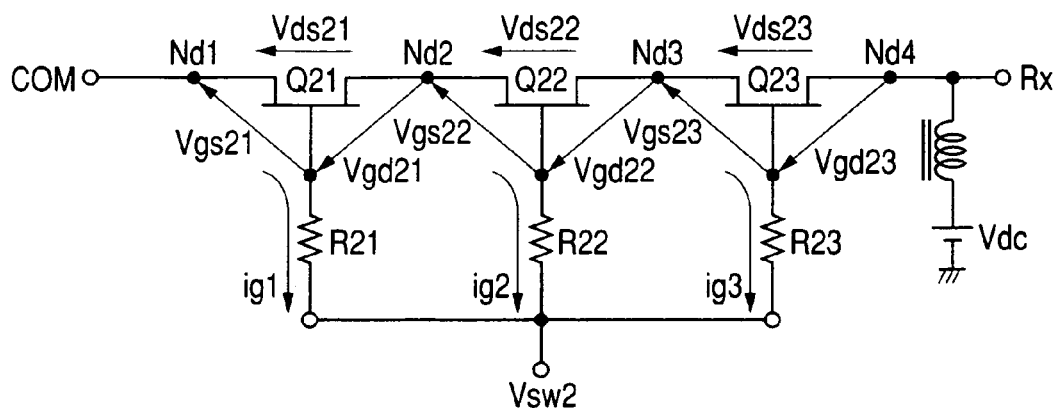
FIG. 3 is a circuit diagram showing a structure of an example of a transmission/reception switch circuit examined by the present inventors.

In a transmission/reception switch circuit using a switch as shown in FIG. 3 which is composed of the transistors Q21, Q22, and Q23 each having the same structure as shown in FIG. 2 and connected in three stages such that the respective gate resistors therefor have the same resistance value and in which a bias voltage Vdc is applied to the receiver terminal Rx via the resistor Rd2 and a switch (a bias power supply point therefor is the transmitter terminal Tx) similarly composed of transistor Q11, Q12, and Q13 connected in three stages such that the respective gate resistors therefor have the same resistance value, potentials Vd1, Vd2, and Vd3 at the respective nodes Nd1, Nd2, and Nd3 closer to the sources of the transistors Q21, Q22, and Q23 in the OFF state (Vsw2=0 V) satisfy Vd1>Vd2>Vd3 so that currents Ig1, Ig2, and Ig3 flowing from the sources to the gates satisfy Ig1>Ig2>Ig3.

Figure 13:
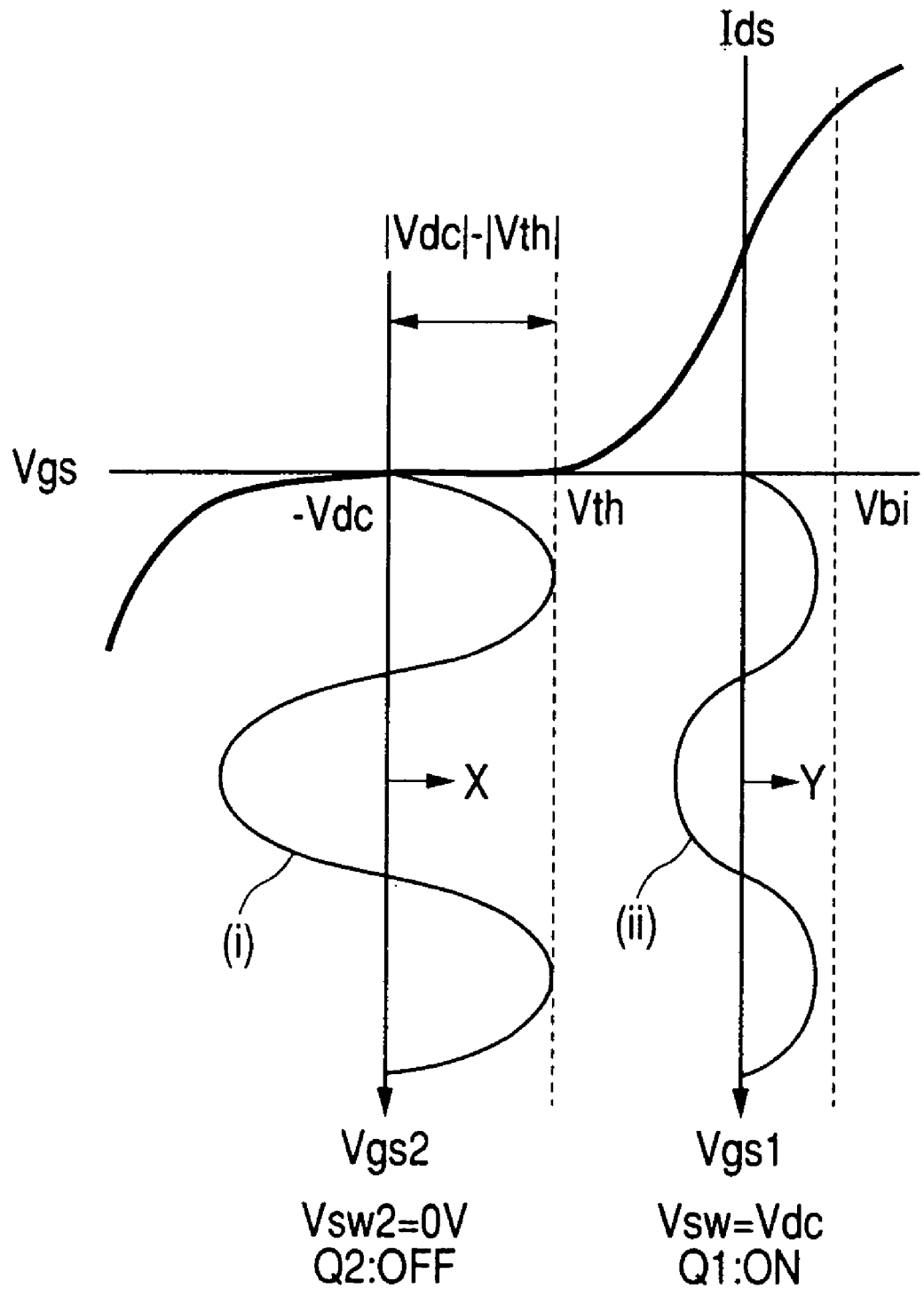
FIG. 13 is a view illustrating the waveform (i) of an RF voltage applied to a gate-source capacitance Cgs2 when a transistor Q2 composing the switch circuit of FIG. 11 is in the OFF state and the waveform (ii) of an RF voltage applied to a gate-source capacitor Cgs1 when the transistor Q2 is in the ON state.

Accordingly, the gate-source voltages Vgs1, Vgs2, and Vgs3 of the transistors Q21, Q22, and Q23 satisfy Vgs1>Vgs2>Vgs3. As a result, when such an RF voltage Vin as has the waveform (i) shown in FIG. 13 is applied to the source of the transistor Q21 closer to the antenna terminal, the gate-source voltage Vgs1 reaches a turn-on voltage (|Vdc|−|Vth|) and shifts to the ON state earlier than in the other transistors Q22 and Q23. As a result, the maximum permissible input voltage of the switch circuit when the transistors Q21, Q22, and Q23 are in the OFF state does not increase so much.

By contrast, if a switch as shown in FIG. 2 is used, the respective values r21, r22, and r23 of the gate resistors R21, R22, and R23 have been set to satisfy a relationship given by r21:r22:r23=3:2:1. As a result, the currents Ig1, Ig2, and Ig3 flow in the gate resistors R21, R22, and R23 so that the respective voltages at the gate electrodes of the transistors Q21, Q22, and Q23 become progressively lower in the order of the transistors Q21, Q22, and Q23 due to a voltage drop, while the gate-source voltages Vgs1, Vgs2, and Vgs3 of the transistors Q21, Q22, and Q23 become substantially the same. This circumvents the situation in which the transistor Q21 close to the antenna terminal is brought into the ON sate earlier than the other transistors Q22 and Q23 so that the maximum permissible input voltage is increased. This may also hold true for the switch circuit of FIG. 1 using a triple gate HEMT as a switching transistor.

In the transistors Q11, Q12, and Q13 which are brought into the ON state during transmission also, the inputted RF voltage Vin is divided between the source and drain of each of the transistors Q11, Q12, and Q13 and the gate-source voltage Vgs1, Vgs2, and Vgs3 satisfy Vgs1>Vgs2>Vgs3. Accordingly, if the gate resistances are the same, the gate-source voltage of the transistor Q11 closest to the transmitter terminal Tx exceeds, earliest of all, a voltage Vbi termed a built-in potential at which a current in a positive direction brings to flow in the gate when the RF voltage indicated by the waveform (ii) of FIG. 13 increases and large quantities of harmonic components are generated.

By contrast, by adjusting the ratio among the resistance values r1, r12, and r13 of the gate resistors R11, R12, and R13 to 3:2:1 as in the embodiment, the gate-source voltages Vgs1, Vgs2, and Vgs3 of the transistors Q11, Q12, and Q13 become substantially the same. This circumvents the situation in which a current begins to flow earliest in the gate of the transistor Q11 closest to the transmitter terminal Tx. This also holds true for the switch circuit of FIG. 1 using the triple gate HEMT as the switching transistor. Since the resistance value of the gate resistor of the transistor on the side on which the RF power is inputted has thus been adjusted to be larger in each of the switching circuit according to the embodiment of FIG. 1 and the switching circuit according to the embodiment of FIG. 2, the maximum permissible input voltage can be set to a value larger than in a switching circuit as shown in FIG. 11.

In addition, the switch circuit of FIG. 1 using the triple gate HEMT is advantageous over the switching circuit of FIG. 2 in which the third transistors are connected in series in that the channel is shorter because there is no region in which a source electrode and a drain electrode are provided midway and that the on-resistance Ron can be reduced because there is no source resistor and no drain resistor, which achieves a reduction in insertion loss. Further, the switching circuits according to the embodiments of FIGS. 1 and 2 are advantageous in that harmonic distortion can be reduced because the bias voltage Vdc for giving the operating point of the RF signal has been applied to the terminal of each of the transistors Q1 and Q2 to which the RF power is inputted.

Figure 11:
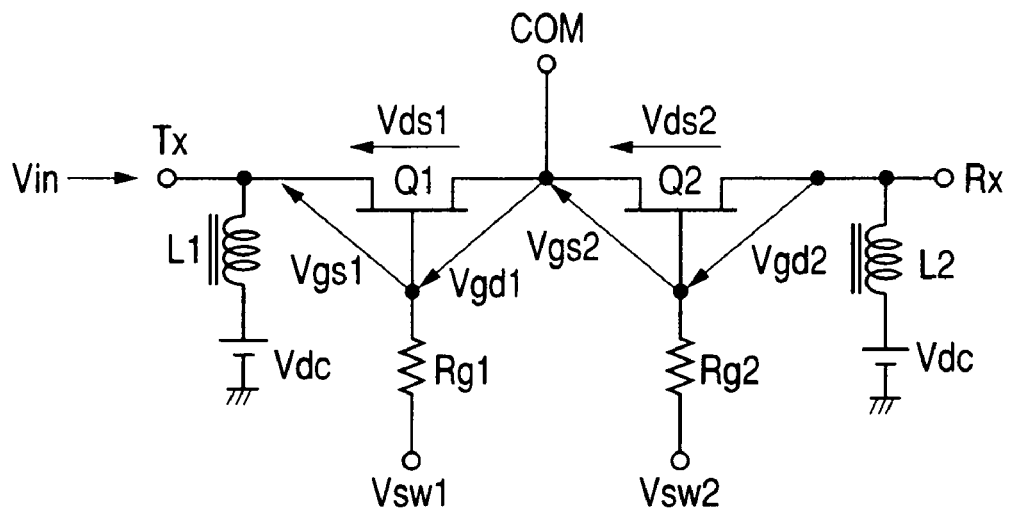
FIG. 11 is a circuit diagram showing a structure of a transmission/reception switch circuit using a HEMT (high electron mobility transistor) examined by the present inventors.
Figure 12:
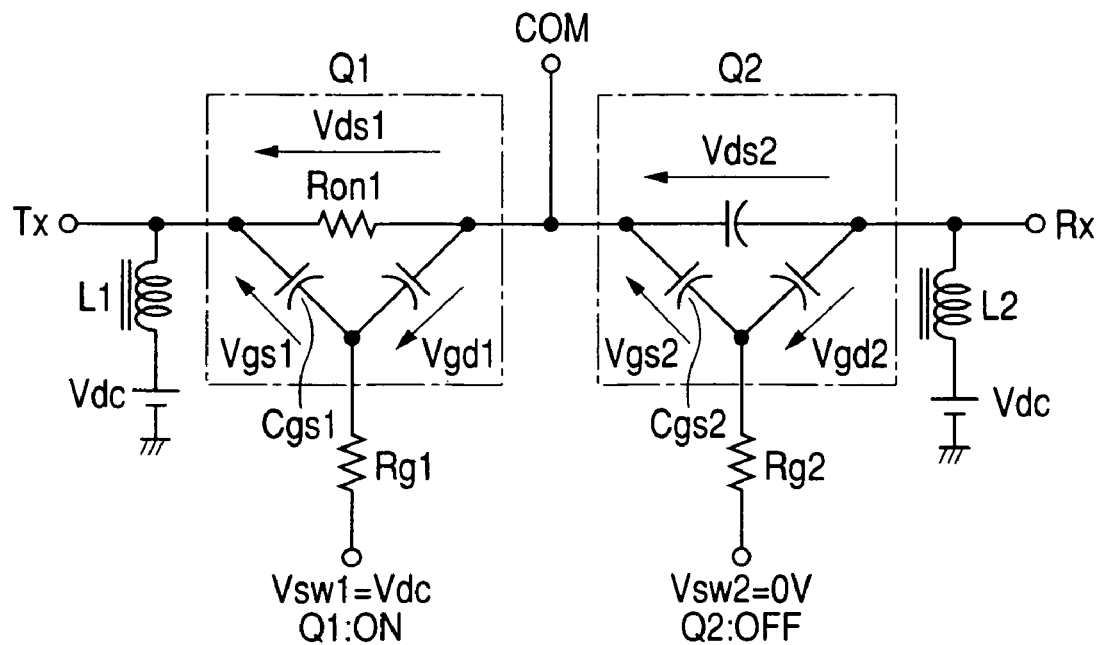
FIG. 12 is an equivalent circuit diagram of the transmission/reception switch circuit in a transmission mode in which the transistor Q1 and Q2 of FIG. 11 are brought into and ON state and an OFF state, respectively.

Although it is conceivably possible to use the terminal opposite to the terminal of the transistor Q2 to which the RF power is inputted as a point to which the bias voltage Vdc is applied, as shown in FIG. 11, the arrangement involves the possibility that, due to the non-linearity of the gate-source capacitance Cgs2 of the transistor Q2, the operating point of the RF signal (the waveform (i) of FIG. 13) shifts as indicated by the arrow X in FIG. 13 to exceed the line of the threshold voltage Vth and increase the harmonic distortion. By contrast, in each of the switching circuits according to the embodiments of FIGS. 1 and 2, the bias voltage Vd has been applied to the terminal of the transistor Q2 to which the RF power is inputted so that the harmonic distortion is reduced.

Likewise, it is also possible to use, in the transistor Q1, the common terminal COM connected to the antenna on the other side, not the transmitter terminal Tx, as the point to which the bias voltage Vdc is applied. However, the arrangement involves the possibility that, due to the non-linearity of the on-resistance Ron of the transistor Q1, the operating point of the RF signal (the waveform (ii) of FIG. 13) shifts as indicated by the arrow Y in FIG. 13 to cause operation in a region where a drain current characteristic is not linear and increase the harmonic distortion. By contrast, since the bias voltage Vdc has been applied to the transmitter terminal Tx of the transistor Q1 to which the RF power is inputted in each of the switching circuits according to the embodiments of FIGS. 1 and 2, the harmonic distortion can be reduced.

Figure 4:
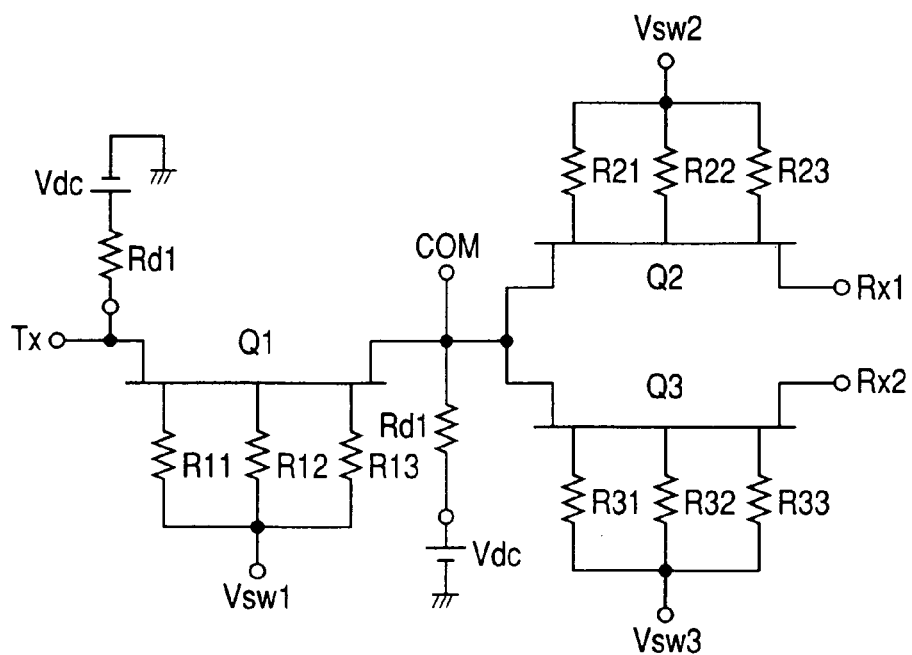
FIG. 4 is a circuit diagram showing a structure of a third embodiment of the transmission/reception switch circuit according to the present invention.

FIG. 4 shows a third embodiment of the transmission/reception switch circuit according to the present invention.

In this embodiment, a switching transistor Q3 is provided between the common terminal COM connected to the antenna and a second receiver terminal Rx2 to be in parallel with the switching transistor Q2 in the embodiment of FIG. 1. The transistor Q3 is composed of a triple gate HEMT, similarly to the transistor Q2. The ratio among the resistance values r31, r32, and r33 of resistors R31, R32, and R33 connected to the gates has been set to 3:2:1. The switching circuit of this embodiment is used conveniently to compose a system capable of transmitting and receiving signals in two different frequency bands, such as signals in the GSM mode and signals in the DCS mode.

Figure 5:
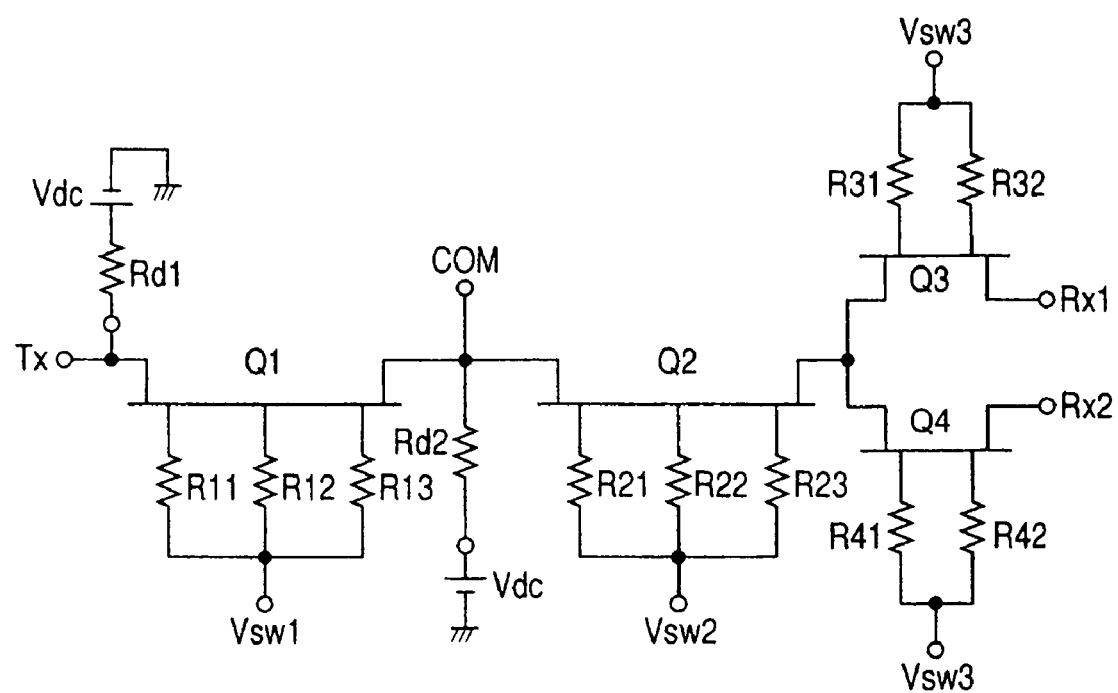
FIG. 5 is a circuit diagram showing a structure of a fourth embodiment of the transmission/reception switch circuit according to the present invention.

FIG. 5 shows a fourth embodiment of the transmission/reception switch circuit according to the present invention.

In this embodiment, switching transistors Q3 and Q4 in a parallel configuration are provided between the switching transistor Q2 in the embodiment of FIG. 1 and the first receiver terminal Rx1 and between the switching transistor Q2 and the second receiver terminal Rx2 to further enhance isolation at the receiver. Each of the transistors Q3 and Q4 is composed of a double-gate HEMT. The resistance values r31, r32, r41, and r42 of the resistances R31, R32, R41, and R42 have been set to satisfy r31□r32 and r41□r42. The switching circuit of this embodiment is also used conveniently to compose a system capable of transmitting and receiving signals in two different frequency bands such as signals in the GSM mode and signals in the DCS mode.

Figure 6:
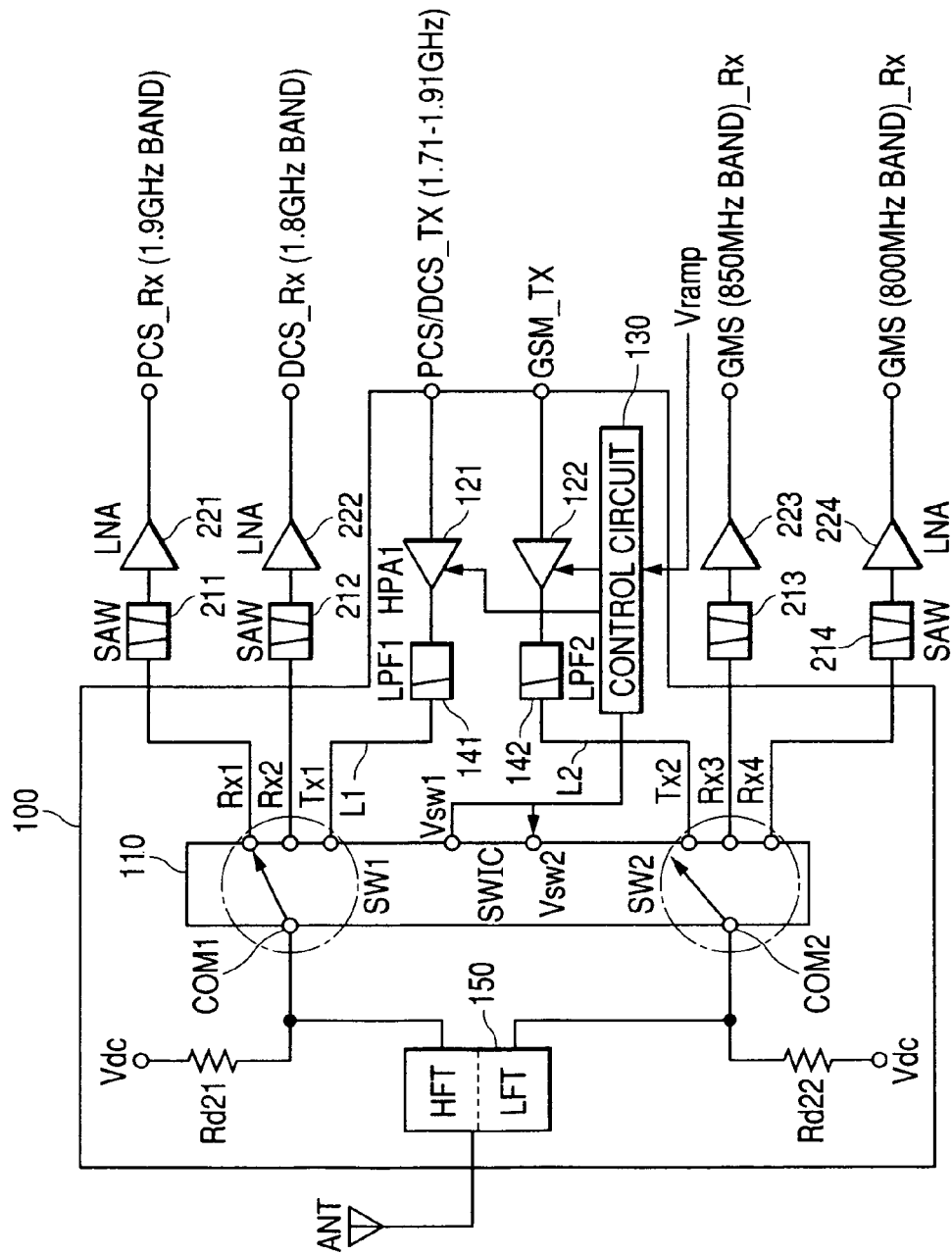
FIG. 6 is a block diagram showing a schematic structure of a preferred embodiment of a module composed of the transmission/reception switch circuit according to the present invention, a power amplifier, and a lowpass filter.

FIG. 6 shows a schematic structure of a preferred embodiment of a module composed of the transmission/reception switching circuit according to the present invention, a power amplifier, and a lowpass filter.

The module according to this embodiment comprises: a switch circuit (SWIC) 110 formed into a semiconductor integrated circuit; a power amplifier 121 for amplifying DCS signals at 1800 MHz to be transmitted and PCS signals at 1900 MHz to be transmitted; a power amplifier 122 for amplifying GSM signals at 800 MHz to 850 MHz to be transmitted; a control circuit 130 for generating signals for controlling the gains of the power amplifiers 121 and 122 and signals for ON/OFF control of a switch in the SWIC 110; lowpass filters 141 and 142 for removing harmonics from RF signals amplified by the power amplifiers 121 and 122; a demultiplexer 150 for separating DCS and PCS transmitted/received signals from GSM transmitted/received signals; and the like, which are mounted on a ceramic substrate 100 composed of a plurality of stacked dielectric layers each made of alumina or the like and having wires or microstrip lines each composed of a conductive layer formed on the top and back surfaces thereof.

The SWIC 110 is composed of two switch circuits as used in the embodiment of FIG. 4 or FIG. 5 which are formed on a single semiconductor chip. The widths of the respective gate electrodes of the switches have been designed such that the gate width of the transistor Q1 composing the GSM switch circuit SW2 is larger than the gate width of the transistor Q1 composing the DCS/PCD switch circuit SW1. A GSM maximum output power is 36 dB, while a DCS/PCS maximum output power is 34 dB. This is because, since the GSM maximum output power is higher, the GSM switch circuit and the DCS/PCD switch circuit do not have the same insertion loss unless the gate widths are set as described above. Instead of changing the gate widths of the transistors composing the switch circuits SW1 and SW2, it is also possible to change the number of gates in the transistor Q1.

Specifically, the number of the gates in the transistor Q1 of the GSM switch circuit SW2 is adjusted to be smaller. The gate widths of the transistors Q2 in the GSM switch circuit SW2 and in the DCS/PCD switch circuit SW1 are determined by a tradeoff between insertion loss and receiver isolation. Each of the power amplifiers 121 and 122 and the control circuit 130 is composed of a single or a plurality of semiconductor chips. Each of the lowpass filters 141 and 142 is composed of a resistor formed of a conductor layer on the ceramic substrate 100 and a capacitance between conductor layers or composed of a resistor element and a capacitor element mounted on the substrate. An impedance matching circuit composed of a microstrip line and an interlayer capacitance is provided between the power amplifiers 121 and 122 and the lowpass filters 141 and 142, though it is not depicted. A bias voltage Vdc is applied to the common terminals COM1 and COM2 of the SWIC 100 via external resistors Rd21 and Rd22, respectively. Likewise, the bias voltage Vdc is also applied to the transmitter terminals Tx1 and Tx2, though it is not depicted. The demultiplexer 150 is composed of a highpass is filter HFT which allows the passage of DCS and PCS transmitted/received signals therethrough and a lowpass filter LFT which allows the passage of GSM transmitted/received signals therethrough.

Outside the module of this embodiment, an antenna ATN is connected to the demultiplexer 150, while low noise amplifiers 221 to 224 for amplifying received signals are connected to the receiver terminals Rx1, Rx2, Rx3, and Rx4 of the SWIC 110 via bandpass filters 211 to 214 each composed of a SAW filter. The low noise amplifiers 221 to 224 can be formed into a single semiconductor integrated circuit (termed an RF IC) together with a modulation circuit for modulating a signal to be transmitted, a mixer for performing up-conversion, a demodulation circuit for demodulating a received signal, a mixer for performing down-conversion, and the like.

The control circuit 130 generates a signal for controlling the gains of the power amplifiers 121 and 122 based on an output level indication signal Vramp supplied from a baseband circuit for generating I and Q signals based on data to be transmitted (a baseband signal) and generating the baseband signal from the demodulated I and Q signals and generates transmission/reception switch voltages Vsw1 and Vsw2 for the switch circuits in the SWIC 110 based on a signal indicative of a mode. The baseband circuit can be constructed as a semiconductor integrated circuit (IC) on a single semiconductor chip.

It has generally been known that the impedance of a transmission line differs depending on the frequency of a signal transmitted by the transmission line. In the embodiment of FIG. 6, therefore, the length of a line (microstrip line) L2 from the lowpass filter 142 to the SWIC 110 has been set to be larger than (about double) the length of a line L1 from the lowpass filter 141 to the SWIC 110 such that the impedance of the line L1 matches the impedance of the line L2. This is because a GSM signal propagated by the line L2 has a frequency lower (about ½) than the frequencies of a DCS signal (1800 MHz) and a PCS signal (1900 MHz). In general, a line on a printed substrate is mostly designed to have a shortest distance propagate by the line L1. In this embodiment, therefore the line L2 is disposed in a meandering configuration to have a path more redundant than the path of the line L1 or, alternatively, the lowpass filter 142 is disposed at a position farther away from the SWIC 110 than the lowpass filter 141.

Figure 7:
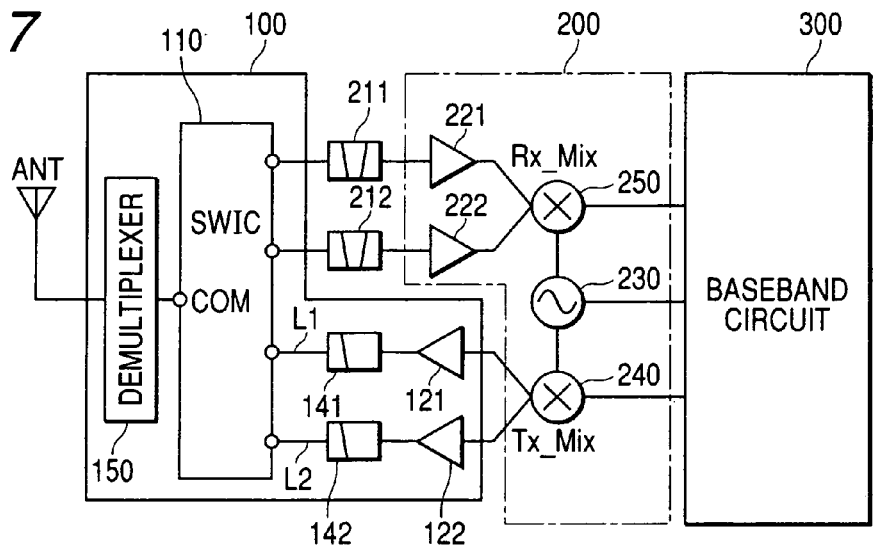
FIG. 7 is a block diagram showing a schematic structure of a second embodiment of the module composed of the transmission/reception switching circuit according to the present invention, the power amplifier, and the lowpass filter and that of a wireless communication system using the module.

FIG. 7 shows a schematic structure of a second embodiment of the module composed of the transmission/reception switching circuit according to the present invention, the power amplifier, and the lowpass filter and that of a wireless communication system using the module. In FIG. 7, the same circuits as shown in FIG. 6 will be denoted by the same reference numerals and the repeated description thereof will be omitted.

In contrast to the module of the embodiment of FIG. 6 constructed to be capable of transmitting/receiving signals in four frequency bands, the module of the embodiment of FIG. 7 is constructed to be capable of transmitting/receiving signals in two frequency bands such as, e.g., GSM signals and DCS signals. The embodiment of FIG. 7 uses, as the SWIC 110, two switch circuits as used in the embodiment of FIG. 1 in a parallel configuration and the common terminal COM connected to the antenna and connected commonly to the two switch circuits, which are formed on a single semiconductor chip. In other words, the embodiment of FIG. 7 uses the switch circuit of FIG. 4 provided with two transmitter terminals Tx and a triple gate transistor provided between the second transmitter terminal Tx2 and the common terminal COM to be in parallel with the transmitter transistor Q1, which are formed on the semiconductor chip.

An RF signal modulated by a mixer 240 for modulation & up-conversion which modulates a signal transmitted from an RF oscillator 230 based on the I and Q signals inputted from a baseband circuit 300 is inputted to the power amplifiers 121 and 122. Received signals amplified by low noise amplifiers 221 and 222 are supplied to a mixer 250 for demodulation & up-conversion where they are demodulated. The demodulated I and Q signals are supplied to the baseband circuit 300 where they are processed. The RF oscillator 230 and the mixers 240 and 250 are formed as a semiconductor integrated circuit (RF IC) 200 on a single semiconductor chip.

Also in the embodiment of FIG. 7, the length of the line (microstrip line) L2 from the lowpass filter 142 to the SWIC 110 has also been set to be larger than that of the line L1 from the lowpass filter 141 to the SWIC 110.

A description will be given next to an embodiment of a device structure when the switch circuit (SWIC 100) of the foregoing embodiment is formed on a semiconductor chip with reference to FIGS. 8 to 10.

Figure 8:
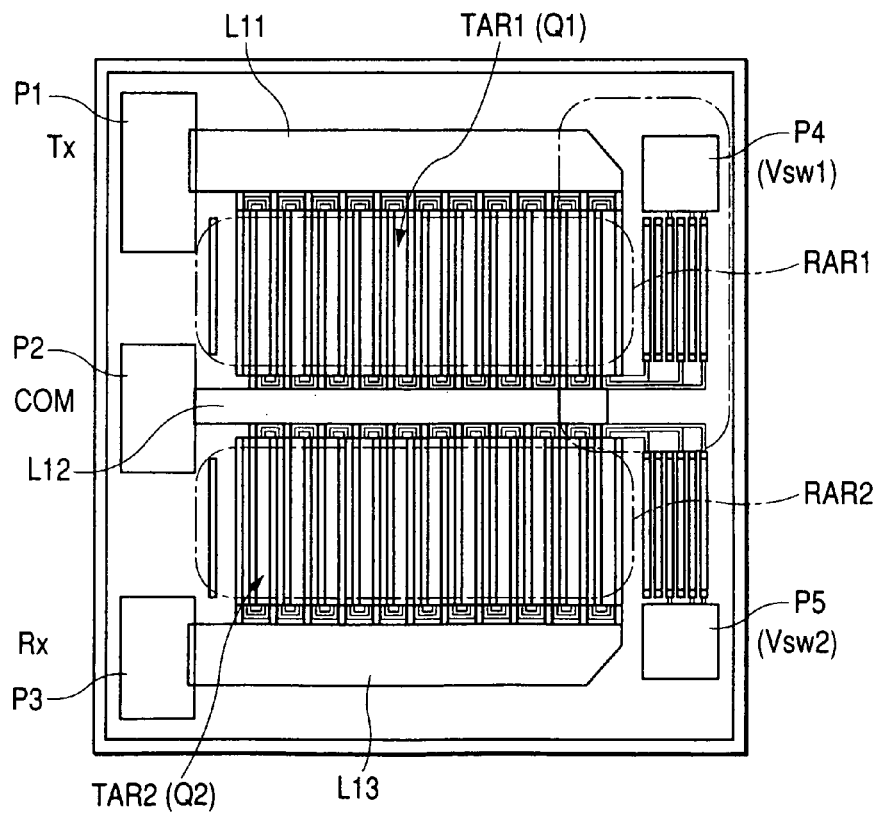
FIG. 8 is a plan view showing a layout structure of an entire SWIC according to an embodiment.

FIG. 8 shows a layout structure of the entire SWIC 100 according to the embodiment. FIG. 9 shows a layout obtained by enlarging the portion inside the enclosure denoted by a reference numeral A in FIG. 8. The SWIC 100 shown in FIG. 8 is obtained by constructing the switch circuit having the single transmitter terminal Tx and the single receiver terminal Rx shown in FIG. 1 as the semiconductor integrated circuit.

In FIG. 8, a reference numeral P1 denotes a bonding pad as the transmitter terminal Tx, P2 denotes a bonding pad as the common terminal COM, P3 denotes a bonding pad as the receiver terminal Rx, and P4 and P5 denote bonding pads to which the ON/OFF control voltages Vsw1 and Vsw2 for switch transistors Q1 and Q2 are inputted. On the other hand, a reference numeral L11 denotes a line composed of a conductive layer made of aluminum or the like and connected to the bonding pad P1 as the transmitter terminal Tx, L12 denotes a line connected to the bonding pad P2 as the common terminal COM, and L13 denotes a line connected to the bonding pad P3 as the receiver terminal Rx.

A transistor formation region TAR1 formed with the positive layer, carrier supply layer, and contact layer of the switch transistor Q1, the source/drain electrodes thereof connected to the contact layer, the gate electrode thereof provided between the source/drain electrodes, and the like is provided on a portion of the surface of the semiconductor chip located between the lines L11 and L12. In addition, a transistor formation region TAR2 formed with the positive layer, carrier supply layer, and contact layer of the switch transistor Q2, the source/drain electrodes thereof connected to the contact layer, the gate electrode thereof provided between the source/drain electrodes, and the like is provided on a portion of the surface of the semiconductor chip located between the lines L12 and L13. Further, resistor formation regions PAR1 and PAR2 formed with resistor layers serving as the gate resistors R11 to R13 of the transistor Q1 and the gate resistors R21 to R23 of the transistor Q2 are formed sidewise (on the right side of the drawing) of these transistors Q1 and Q2.

Figure 9:
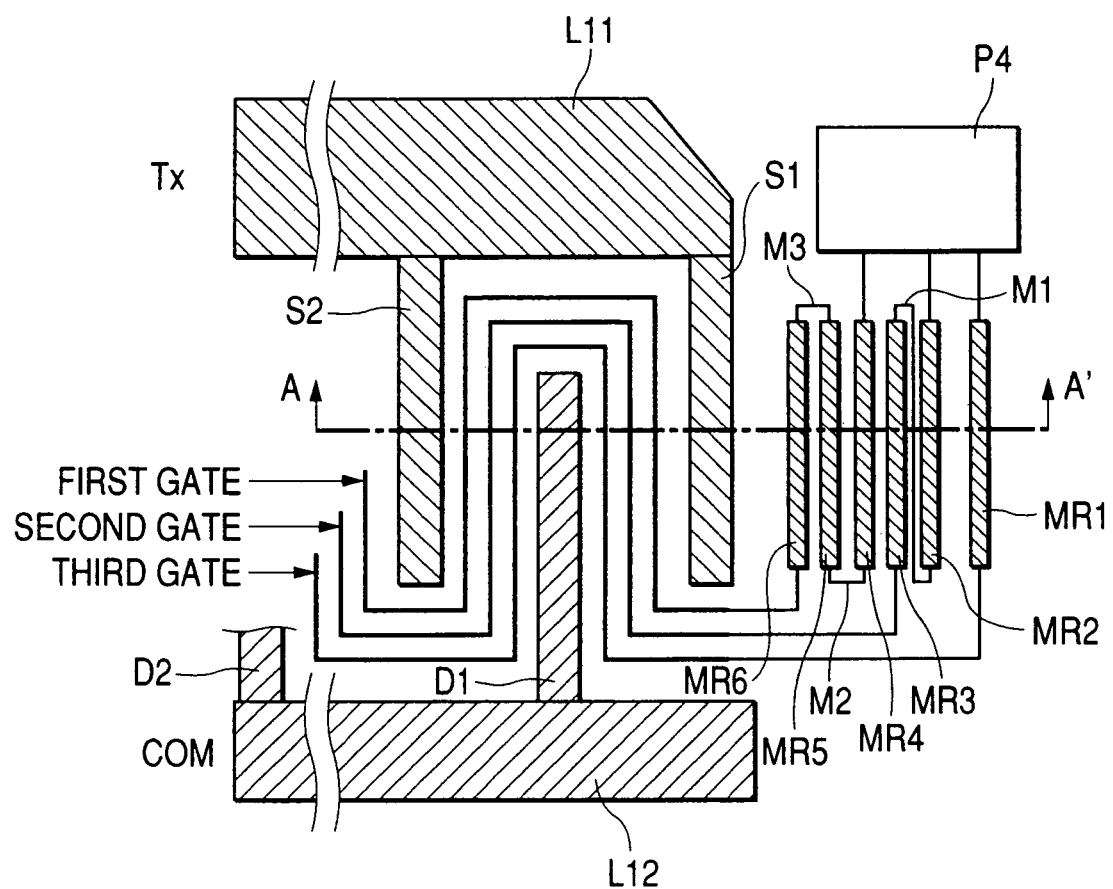
FIG. 9 is a plan view showing a layout obtained by enlarging the portion inside an enclosure denoted by a reference numeral A in FIG. 8.

As shown in enlarged relation in FIG. 9, the gate resistors R11 to R13 and R21 to R23 formed in the resistor formation regions RAR1 and RAR2 are composed of resistor layers MR1 to MR6 made of WSiN (tungsten silicide) set to a specified length or the like in the present embodiment. Specifically, the gate resistors R13 and R23 each having a smallest resistance value are composed of the single resistor layer MR1, the gate resistors R12 and R22 each having a resistance value double the resistance values of the gate resistors R13 and R23 are composed of the two resistor layers MR2 and MR3, and the gate resistors R11 and R21 each having a resistance value triple the resistance values of the gate resistors R13 and R23 are composed of the three resistor layers MR4 to MR6, respectively. The resistor layers MR1 to MR6 are designed to have the same length and the same resistance value. In the case of using a plurality of resistor layers such as the gate resistors R11, R21, R12, and R22, the individual resistor layers are connected in series by interconnect layers M1 to M4.

In the transistor formation region TAR1, the source electrodes S1, S2, . . . are formed in a comb-shaped configuration in a direction from the line L11 toward the line L12 and the drain electrodes D1, D2, . . . are formed in a comb-shaped configuration in a direction from the line L12 toward the line L11. Between these electrodes, metal layers GM1, GM2, and GM3 serving as the gate electrodes are arranged in mutually parallel and meandering relation.

Figure 10A:
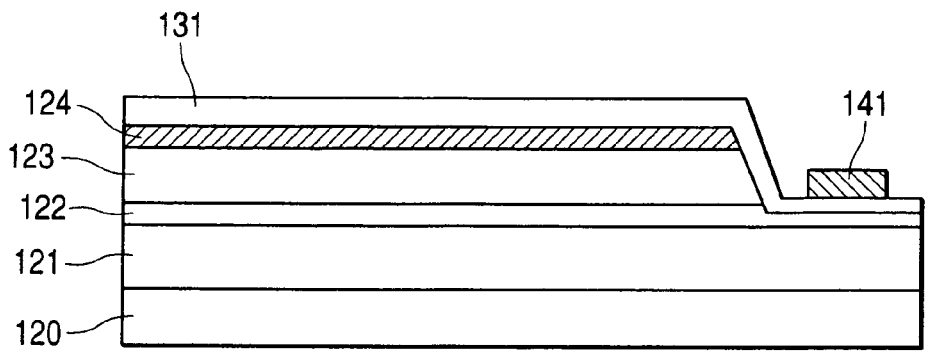
FIG. 10A to 10C are cross-sectional views taken along the line A-A of FIG. 9 and illustrating individual fabrication steps in the order they are performed.
Figure 10B:
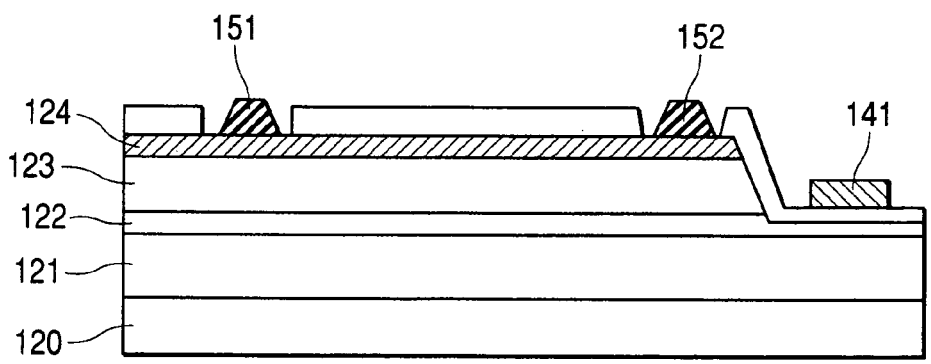
Figure 10C:
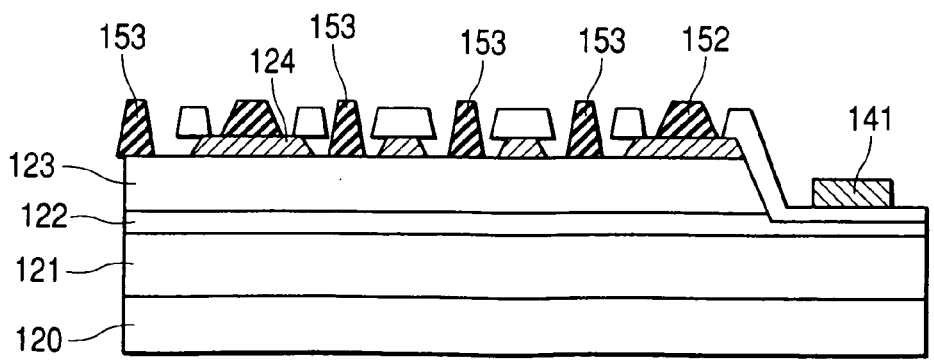

A description will be given next to an example of a cross-sectional structure of the switch transistors Q1 and Q2 composing the SWIC and the gate resistors R11 to R23 and a fabrication method therefor with reference to FIG. 10A to 10C which are cross-sectional views taken along the line A-A' of FIG. 9 and illustrating individual fabrication steps in the order they are performed.

First, in the same manner as in a normal HEMT fabrication process, a GaAs epitaxial layer 121, a GaAs layer 122 serving as an operating layer, an AlGaAs layer 123 serving as a carrier supply layer, and an n-GaAs layer 124 serving as a low-resistance contact layer are formed successively on a semiconductor insulating GaAs substrate 120. Then, the portion except for the transistor formation region is etched away and an insulating film 131 composed of a PSG film and an SiO film is formed. Subsequently, a WSiN film is formed on the insulating film 131 and then patterned to form a resistor layer 141 serving as gate resistors so that the state shown in FIG. 10A is reached.

Thereafter, openings are formed in the portion of the insulating film 131 located over the transistor formation region by selective etching. Then, metal layers 151 and 152 serving as source/drain electrodes are formed in the openings so that the state shown in FIG. 10B is reached. Subsequently, the respective portions of the insulating film 131 and the n-GaAs layer 124 located between the metal layers 151 and 152 are selectively etched such that three openings are formed. A metal layer 153 serving as the gate electrodes in contact with the AlGaAs layer 123 is formed in each of the three openings so that the state shown in FIG. 10C is reached.

Although the specific description has been given thus far to the embodiments of the invention achieved by the present inventors, the present invention is not limited to the foregoing embodiments. It will easily be appreciated that various modifications and changes can be made without departing from the gist thereof.

For example, although the foregoing embodiments have applied the dc voltage Vdc which gives a bias point to each of the transmitter terminal Tx and the common terminal COM via the resistor, it is also possible to apply the dc voltage Vdc via an inductor such as a choke coil. In that case, the inductor may also be composed of an external element or an on-chip element formed on the same chip on which the transistors Q1 and Q2 are formed.

Although the dual gate transistors Q3 and Q4 are connected in series to the triple gate transistor Q2 in the example of FIG. 5, the transistors Q3 and Q4 may also be single gate transistors. Although the foregoing embodiments have described the HEMTs as transistors used to compose the switch circuit, it is also possible to use other FETs such as MESFETs in place of the HEMTs.

Although the foregoing embodiments have used WSiN as the gate resistors connected to the gates of the switch transistors Q1 and Q2, it is also possible to form the gate resistors by using a refractory metal having a relatively high sheet resistance other than WSi, a silicide of a refractory metal, or a plurality of stacked layers composed thereof.

Although the description has been given to the case where the present invention is applied to a switch circuit suitable for a quad band system constructed to be capable of communication in accordance with the four modes of the GSM 800, the GSM 850, the DCS 1800, and the PCS 1900 and a dual band system constructed to be capable of communication in accordance with the two modes of the GSM and the DCS and to a module on which the switch circuit is mounted together with power amplifiers, the present invention is not limited thereto. The present invention is also applicable to a switch circuit used for a system such as a wireless LAN which transmits and receives signals in, e.g., the 2.4 GHz band and the 5 GHz band.

The following is a brief description of effects achievable by the representative aspects of the present invention disclosed in the present application.

Specifically, by using a FET in place of a diode as an element composing a switch circuit in accordance with the present invention, the number of components composing a communication system and a module (electronic component for communication) can be reduced and the mounting density can be increased. By controlling the resistance values of the gate resistors such that they become progressively smaller in a direction from the gate to which a highest voltage is applied toward the gate to which a lowest voltage is applied, it becomes possible to circumvent the situation in which a FET to which a higher voltage is inputted is brought into the ON state earlier, reduce insertion loss, and reduce harmonic distortion.

By further applying a dc voltage for biasing to each of a transmitter terminal and a terminal connected to an antenna, the maximum permissible power of an RF signal inputted to the transmitter terminal can be increased. As a result, even when a wireless communication system having a large maximum output power is used, the insertion loss is small and leakage power from a transmitter to a receiver is small in amount so that harmonic distortion is thereby reduced.

What is claimed is:

1. A semiconductor device for switching transmission and reception, comprising:
    a first switch provided between a first terminal connected to a transmission/reception antenna and a second terminal connected to a transmission circuit; and
    a second switch provided between said first terminal and a third terminal connected to a reception circuit,
    wherein said semiconductor device performs switching between a signal to be transmitted and a received signal through an ON/OFF operation of said first and second switches, and
    wherein said second switch is comprised of a single multi-gate transistor or a plurality of transistors connected in series, respective resistor elements are connected between a plurality of gate terminals of the multi-gate transistor or plurality of transistors and a control input terminal used commonly thereamong, and resistance values of the resistor elements are set such that the resistor element connected to the gate terminal closer to said first terminal has a larger resistance value.

2. A semiconductor device according to claim 1, wherein said first switch is comprised of a single multi-gate transistor or a plurality of transistors connected in series, respective resistor elements are connected between a plurality of gate terminals of the single multi-gate transistor or the plurality of transistors and a control input terminal used commonly thereamong, and resistance values of the resistor elements are set such that the resistor element connected to the gate terminal closer to said first terminal has a larger resistance value.

3. A semiconductor device according to claim 1, wherein each of said resistor elements is constituted by a refractory metal layer or a silicide layer of a refractory metal formed in a specified pattern over an insulating film outside a transistor formation region of a semiconductor substrate formed with said transistor or transistors.

4. A semiconductor device according to claim 1, wherein said second switch is constituted by the multi-gate transistor and a second transistor connected between said first and third terminals in series relation to said multi-gate transistor, respective resistor elements are connected between a plurality of gate terminals of said multi-gate transistor and a control input terminal used commonly thereamong, and resistance values of the resistor elements are set such that the resistor element connected to the gate terminal closer to said first terminal has a larger resistance value.

5. A semiconductor device according to claim 1, further comprising:
    a third switch connected between said first terminal and a fourth terminal connected to a second reception circuit,
    wherein said third switch is comprised of a single multi-gate transistor or a plurality of transistors connected in series, respective resistor elements are connected between a plurality of gate terminals of the multi-gate transistor or the plurality of transistors and a control input terminal used commonly thereamong, and resistance values of the resistor elements are set such that the resistor element connected to the gate terminal closer to said first terminal has a larger resistance value.

* * * * *